United States Patent [19]

Inoue et al.

[11] 4,176,302
[45] Nov. 27, 1979

[54] VERTICAL DEFLECTION OUTPUT CIRCUIT

[75] Inventors: Fumio Inoue, Yokohama; Michio Masuda, Tokyo, both of Japan

[73] Assignee: Hitachi, Ltd., Japan

[21] Appl. No.: 787,843

[22] Filed: Apr. 15, 1977

[30] Foreign Application Priority Data

| Apr. 19, 1976 [JP] | Japan | 51-43552 |
| Apr. 19, 1976 [JP] | Japan | 51-43557 |
| Apr. 19, 1976 [JP] | Japan | 51-43558 |
| Apr. 19, 1976 [JP] | Japan | 51-43559 |
| Apr. 19, 1976 [JP] | Japan | 51-43560 |
| Apr. 19, 1976 [JP] | Japan | 51-43561 |

[51] Int. Cl.$^2$ .................................. H01J 29/70
[52] U.S. Cl. .................................. 315/397; 315/411
[58] Field of Search .................. 315/397, 411 (U.S. only)

[56] References Cited

U.S. PATENT DOCUMENTS

| 3,758,813 | 9/1973  | Kitamura    | 315/397 X |
| 3,845,352 | 10/1974 | Newman et al. | 315/411 X |
| 3,970,780 | 7/1976  | Minoura     | 315/411 X |

Primary Examiner—Malcolm F. Hubler
Attorney, Agent, or Firm—Craig and Antonelli

[57] ABSTRACT

A pair of output transistors forming a single-ended push-pull circuit are alternately turned on and off at a vertical cycle to supply a vertical deflection current to a vertical deflection yoke. A low voltage winding is wound on a horizontal flyback transformer connected to a horizontal output transistor. First and second rectifying circuits are provided for rectifying and filtering a horizontal scan period portion and a horizontal flyback portion, respectively, of the voltage developed across the winding, and d.c. outputs of the rectifying circuits are fed to the push-pull circuit as operating power therefor. The first rectifying circuit includes a capacitor-input filter circuit while the second rectifying circuit includes a choke-input filter circuit, a critical current of which choke-input filter is established between a maximum current and a minimum current required for the push-pull circuit.

10 Claims, 10 Drawing Figures

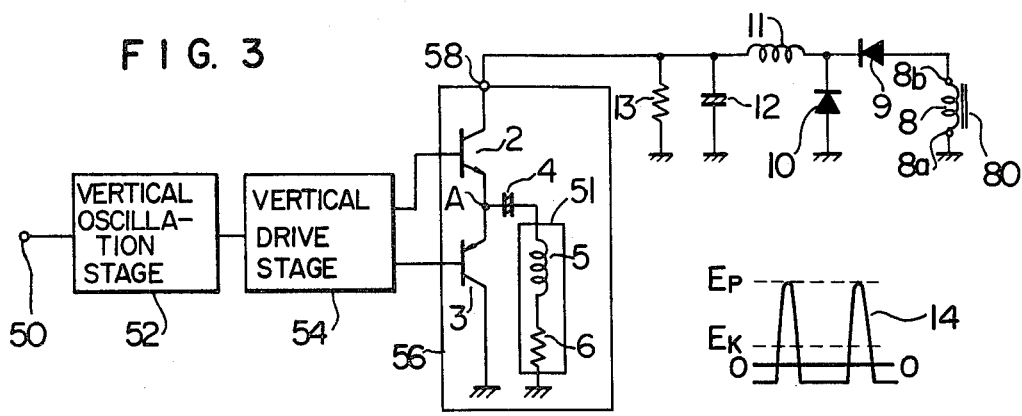
FIG. 3
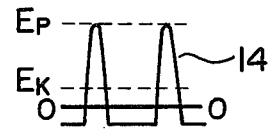
FIG. 4
$$R = \frac{E_R}{I_R}$$
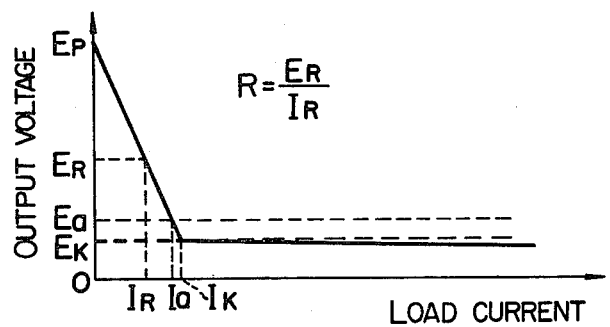

F I G. 7
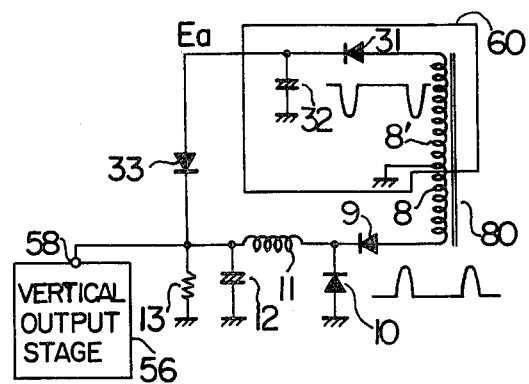
F I G. 8
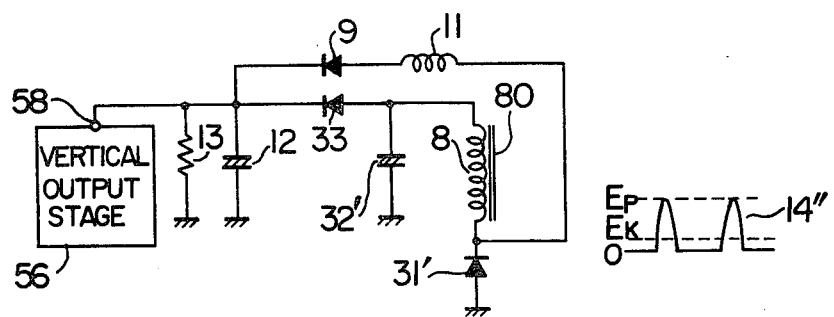

F I G. 9
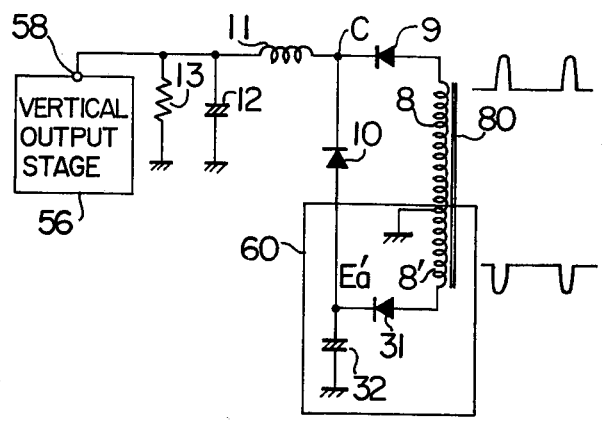
F I G. 10
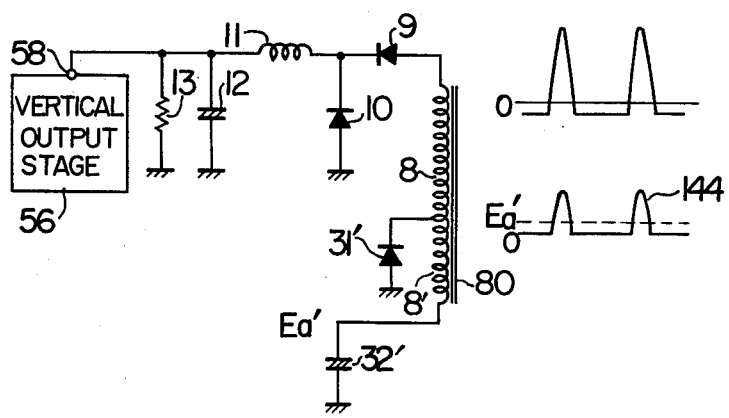

VERTICAL DEFLECTION OUTPUT CIRCUIT

The present invention relates to a push-pull type vertical deflection output circuit for use in a television receiver or the like.

In the past, the vertical deflection output circuit had such a disadvantage that its power consumption was high since such a high voltage as required only during a vertical retrace period was continuously applied to the vertical deflection output stage during a vertical scan period as well.

Accordingly, it is an object of the present invention to provide a vertical deflection output circuit which is simple in construction and has an improved power efficiency.

It is another object of the present invention to provide a vertical deflection output circuit which can improve the power efficiency without the power consumption of the other circuits being increased.

In accordance with the present invention, there is provided a vertical deflection output circuit which comprises a power supply circuit and a single-ended push-pull circuit loaded with a vertical deflection yoke which requires a first operating voltage for feeding a predetermined vertical deflection current to the vertical deflection yoke during a vertical scan period, and a second operating voltage, which is higher than the first voltage, for restoring the vertical deflection current from a magnitude corresponding to the end of the vertical scan to a magnitude corresponding to the start of the vertical scan during a vertical retrace period. In order to supply the operating voltages to the single-ended push-pull circuit, the power supply circuit includes a choke-input rectifying circuit having a rectifier element for rectifying an a.c. component and a choke coil for filtering the rectified a.c. component, and a voltage source for supplying a periodic voltage to the choke-input rectifying circuit. The periodic voltage is established such that its peak value in a polarity to render the rectifying element conductive is not lower than the second operating voltage and its mean value in that polarity is not higher than the first operating voltage.

Other objects and many attendant advantages of the invention will become apparent from a reading of the following detailed description together with the drawings, wherein like reference numerals refer to like parts throughout and in which:

FIG. 3 is a circuit diagram showing one embodiment of a vertical deflection output circuit according to the present invention.

FIG. 4 shows a voltage-current characteristic of a choke-input rectifying circuit.

FIG. 6 through FIG. 10 show circuit diagrams of other embodiments of the vertical deflection output circuit according to the present invention.

Figure 1:
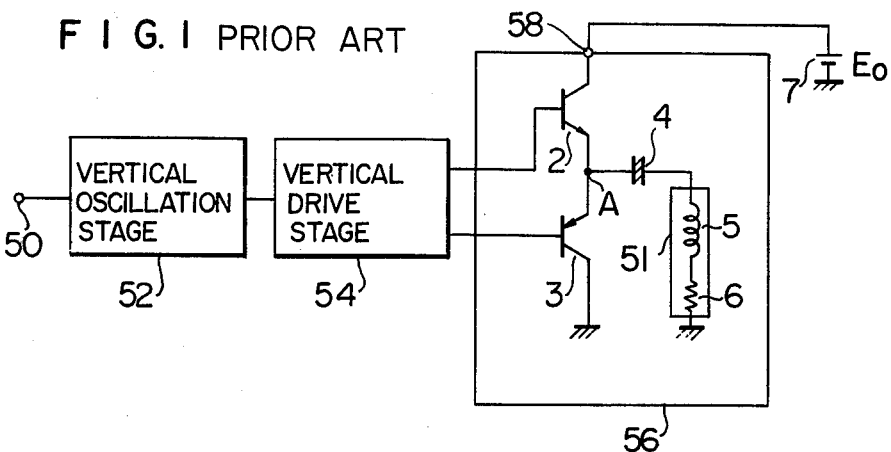
FIG. 1 is a circuit diagram showing a prior art vertical deflection circuit output circuit.

FIG. 1 shows a block diagram of a vertical deflection circuit, in which numeral 50 denotes an input terminal to which a vertical synchronizing signal is applied, 52 denotes a vertical oscillation stage, 54 denotes a vertical drive stage, 56 denotes a vertical output stage and 58 denotes a terminal to which operating power for driving the vertical output stage is applied. The vertical output stage 56 comprises output transistors 2 and 3 connected in a single-ended push-pull configuration, a d.c. blocking capacitor 4 and a vertical deflection yoke 51. The output transistor 2 is rendered conductive by a drive signal from the drive stage 54 during an earlier half of a vertical scan period while the output transistor 3 is rendered conductive during a later half of the vertical scan period so that a saw-tooth wave current at a vertical cycle is fed to the vertical deflection yoke 51. Since the vertical deflection current flowing in the vertical deflection yoke 51 must be reversed in a given retrace period, a high power supply voltage is applied during this period to supply a reverse current to the vertical deflection yoke 51.

Figure 2:
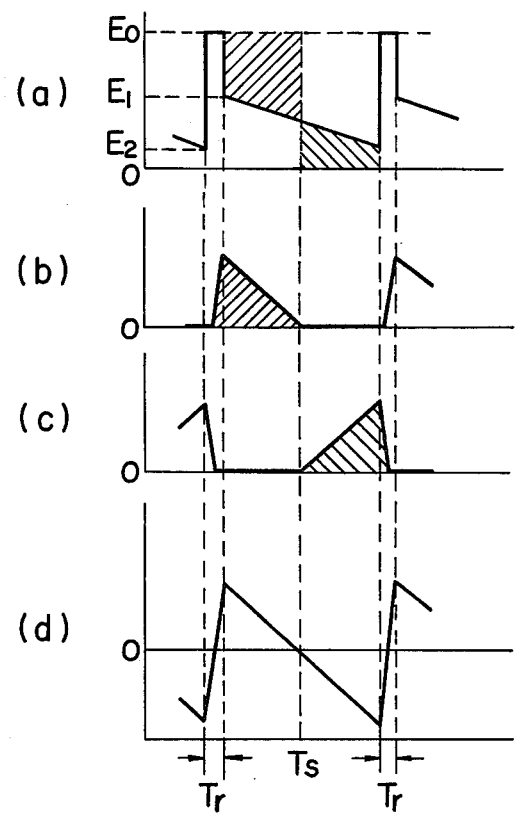
FIG. 2 shows voltage and current waveforms at various points in the vertical deflection circuit of FIG. 1.

FIG. 2 shows voltage and current waveforms at various points in the vertical output stage 56. FIG. 2 (a) shows a voltage waveform appearing at a junction point A of the emitters of the output transistors 2 and 3. A collector voltage of the output transistor 2 is always fixed to a voltage $E_o$ of the power supply 7, and a collector voltage of the output transistor 3 is always fixed to a ground potential. An amplitude $E_1-E_2$ of the emitter output voltage in the vertical scan period $T_s$ corresponds to a voltage drop developed across a resistive component 6 of the vertical deflection yoke 51 by the vertical deflection current. In order to reduce the vertical retrace period $T_r$, the power supply voltage $E_o$ must be higher than a voltage $E_o'$ defined by;

$$E_o' = I_{DY}(R + (L/T_r))$$

where $I_{DY}$ is an amplitude of the vertical deflection current, R is a resistance of the resistive component 6, and L is an inductance of an inductive component of the vertical deflection yoke 51. Where a conventional deflection yoke 51 is used, the power supply voltage $E_o$ should be chosen to be two or three times as high as the voltage $E_1-E_2$ in order to prevent the vertical retrace period $T_r$ from being broadened.

FIG. 2 (b) shows a collector current waveform of the output transistor 2, and FIG. 2 (c) shows a collector current waveform of the output transistor 3, and FIG. 2 (d) shows a waveform of the vertical deflection current flowing in the vertical deflection yoke 51. The power consumed by the output transistor 2 is the mean value of a product of the collector current flowing during the earlier half of the vertical scan period $T_s$ (an area shown by left-downward directed hatching in FIG. 2 (b)) and a collector-emitter voltage during that period (an area shown by left-downward directed hatching in FIG. 2 (a)). Since the considerably high voltage $E_o$ is applied in order to terminate the vertical retrace period $T_r$ within the given short period, the consumed power is considerably high. The power consumed by the output transistor 3 is the mean value of a product of the collector current flowing during the later half of the vertical scan period $T_s$ (an area shown by right-downward directed hatching in FIG. 2 (c)) and a collector-emitter voltage during that period (an area shown by right-downward directed hatching in FIG. 2 (a)).

Thus, the vertical output stage 56 shown in FIG. 1 has a disadvantage that the power consumption is necessarily high because the high voltage, which is required only during the vertical retrace period $T_r$, is also applied during the vertical scan period $T_s$ for which such a high voltage need not be applied.

Various vertical deflection output circuits of reduced power consumption have been proposed. In one example, a switch comprising transistors or the like is provided to switch the voltage applied to the vertical output stage 56 such that the voltage $E_o$ is applied thereto only during the vertical retrace period $T_r$ and the voltage $E_1$ is applied thereto during the vertical scan period $T_s$. In another example, a high internal impedance is imparted to the power supply circuit which supplies the operating power to the vertical output stage 56 such that a lower power supply voltage is produced by a load current during the earlier half of the vertical scan period $T_s$ during which the load current flows from the power supply circuit to the vertical output stage 56 while a higher power supply voltage is produced during the later half of the vertical scan period and the vertical retrace period $T_r$. In the former, however, additional components such as transistors for forming the switches are required and hence the circuit becomes complex. Furthermore, since the transistors are generally apt to be broken by overvoltage, this construction is not desirable from a standpoint of reliability. In the latter apparatus, it is difficult to suddenly reduce the power supply voltage at the transient time from the vertical retrace period $T_r$ to the vertical scan period $T_s$. Furthermore, since the reduction of the power supply voltage is attained by the power consumption in the power supply circuit, the reduction of the overall power consumption of the electronic apparatus cannot be attained.

FIG. 3 is a circuit diagram showing one embodiment of a vertical deflection output circuit according to the present invention. In FIG. 3, like parts to those shown in FIG. 1 are designated by like reference numerals. Numeral 8 denotes a low voltage winding of a horizontal flyback transformer 80 having one end 8a thereof grounded so that a horizontal flyback pulse of positive polarity as shown by 14 appears at the other end 8b. Numeral 9 denotes a rectifying diode, the anode of which is connected to the other end 8b of the low voltage winding 8 and the cathode of which is connected to one end of a choke coil 11, the other end of which is grounded through a filter capacitor 12. Numeral 10 denotes a diode which conducts during the off-period of the diode 9 to allow continuous flow of the current flowing in the choke coil 11. It is called a flywheel diode. Numeral 13 denotes a resistor, which will be inserted in parallel with a capacitor 12 in the case where an a.c. voltage waveform to be rectified by the choke-input rectifier circuit is improper as described later. The resistor may be eliminated in the case where the a.c. voltage waveform is proper.

The voltage-current characteristic of the choke-input rectifier circuit comprising the diodes 9, 10, the choke coil 11 and the capacitor 12 is shown in FIG. 4. Before a load current reaches a critical current $I_k$ from zero, a current flowing in the choke coil 11 is discontinuous and an output voltage considerably changes with the load current, but when the load current exceeds the critical current $I_k$, a continuous current flows in the choke coil 11 so that the output voltage is kept constant irrespective of the magnitude of the load current. A voltage $E_p$ at no load condition is the peak value of the a.c. voltage, and a voltage $E_k$ at the critical current $I_k$ is the mean value of a positive polarity (which renders the diode 9 conductive) of the a.c. voltage. In FIG. 4, a variation of the output voltage when the load current is lower than the critical current $I_k$ depends on the inductance of the choke coil 11 and the duty factor of the power supply pulse, and a change (gradient) of the output voltage when the load current exceeds the critical current $I_k$ represents a voltage drop due to internal resistances of the winding 8, diodes 9, 10 and choke coil 11. The characteristic shown in FIG. 4 is observed in a conventional choke-input rectifying circuit irrespective of the waveform of the a.c. voltage.

Since the duty factor of the horizontal flyback pulse 14 developed across the low voltage winding 8 of the flyback transformer 80 is approximately 1/6, the output voltage $E_k$ at the critical current $I_k$ is approximately one-sixth as high as the output voltage $E_p$ is at zero load current.

It is sufficient that the amplitude $E_o$–$E_2$ of the vertical retrace pulse required to reverse the vertical deflection current within the given short vertical retrace period $T_r$ is usually two or three times as high as the amplitude $E_1$–$E_2$ in the vertical scan period.

Accordingly, in the embodiment of FIG. 3, a resistor 13 is connected in parallel with a capacitor 12 and a minimum load current $I_R$ flows through the resistor 13 to suppress the output voltage to a maximum voltage $E_R$. Thus, by properly setting the resistance of the resistor 13, it is possible to establish a desired value of the maximum voltage $E_R$.

Figure 5:
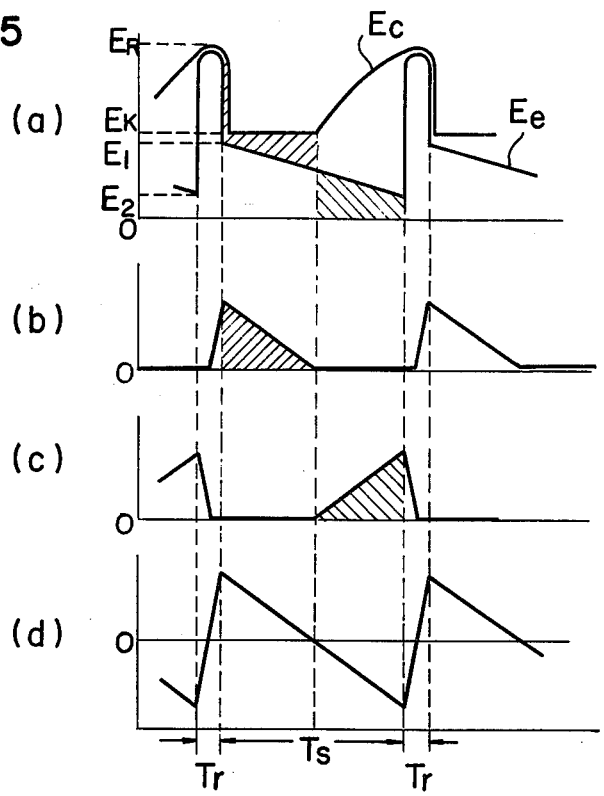
FIG. 5 shows voltage and current waveforms at various points in the vertical deflection output circuit of FIG. 3.

FIG. 5 shows waveforms at various points in the vertical output stage 56 shown in FIG. 3. The operation of the embodiment of FIG. 3 is explained with reference to FIG. 5.

FIG. 5 (a) shows the emitter voltage waveform $E_e$ and the collector voltage waveform $E_c$ of the output transistor 2. FIG. 5 (b) shows the collector current waveform of the output transistor 2, FIG. 5 (c) shows the collector current waveform of the output transistor 3 and FIG. 5 (d) shows the current waveform flowing in the deflection yoke 51.

During the vertical retrace period $T_r$, the collector voltage $E_c$ of the transistor 2 assumes the voltage $E_R$ determined by the current flowing through the resistor 13 and this voltage is substantially equal to a retrace pulse voltage appearing at the emitter of the transistor 2. During the earlier half of the vertical scan period during which the collector current flows in the output transistor 2, the collector voltage $E_c$ decreases to the voltage $E_k$ described in conjunction with FIG. 5, and the collector-emitter voltage of the output transistor 2 also decreases as shown by left-downward directed hatching in FIG. 5 (a) so that the power consumption of the output transistor 2 is substantially reduced as compared with the prior art apparatus.

More particularly, during the vertical retrace period $T_r$, the load current in the rectifying circuit is sufficiently smaller than the critical value $I_k$ while the collector and emitter voltages of the output transistor 2 assume the same values $E_c$ and $E_R$ as in the prior art apparatus. During the earlier half of the vertical scan period, the collector current which is larger than the critical current $I_k$ flows in the output transistor 2, which collector current flows as the load current in the rectifying circuit. As a result, the collector voltage is maintained substantially at the voltage $E_k$. During the later half of the vertical scan period, the output transistor 2 is rendered non-conductive so that the capacitor 12 is charged by the rectifying circuit. As a result, the collector voltage $E_c$ rises. The time during which the collector voltage $E_c$ rises is determined by the a.c. voltage waveform supplied to the rectifying circuit, the inductance of the choke coil 11 and the capacitance of the capacitor 12. When the time at which the collector voltage $E_c$ reaches $E_R$ occurs earlier than the time at which the vertical retrace period $T_r$ starts, the resistor 13 limits the collector voltage $E_c$ to the voltage $E_R$. The time required for the collector voltage $E_c$ to be decreased from the voltage $E_R$ to the voltage $E_k$ is determined mainly by the capacitance of the capacitor 12. If the capacitance is too small, the sharply increasing load current, which is required in the later half of the vertical retrace period, cannot be supplied. On the other hand, if the capacitance is too large, a long period of time is required for the collector voltage $E_c$ to be decreased and the merit of reduction of power consumption is lost.

Since the power consumption in the output transistors 2 and 3 is determined by the products of the collector currents and the collector-emitter voltages, respectively, of the transistors 2 and 3 during the periods of time when the collector currents flow through respective transistors, it can be determined by the hatched areas in FIGS. 5 (a) through (c), like in the case of FIG. 2. Now, comparing FIG. 5 with FIG. 2, the collector-emitter voltage of the output transistor 2 in the embodiment of FIG. 3 has been reduced considerably as compared with the prior art apparatus. Thus, the power consumption in the vertical output stage 56 can be reduced substantially.

While the horizontal flyback pulse 14 of positive polarity derived from the low voltage winding 8 of the flyback transformer 80 is used as the pulse input in the above embodiment, another a.c. power supply may be used. For example, in the case where a switching regulator is used as a power supply circuit of a television receiver, a switching pulse thereof may be used as the pulse input.

When a pulse voltage having a proper duty factor of the input pulse is used, the resistor 13 may be omitted because the ratio of the voltages $E_p$ and $E_k$ in the voltage-current characteristic of the rectifying circuit in the illustrated embodiment matches with the voltage ratio required to the vertical output stage 56.

It should be understood that the present invention can also be applied to an arrangement in which the vertical deflection output stage 56 comprises a so-called shunt regulated push-pull type output circuit wherein an output transistor corresponding to the output transistor 2 is operated at class B while an output transistor corresponding to the output transistor 3 is operated at class A.

Figure 6:
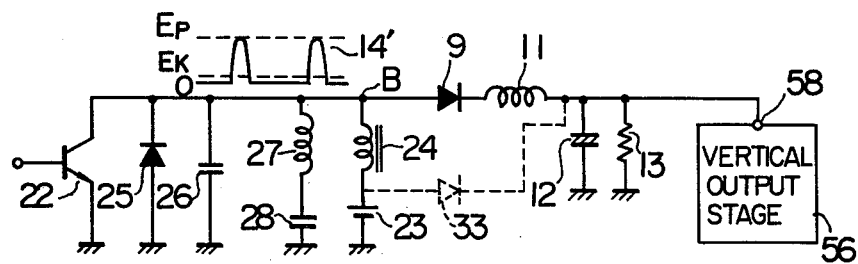

FIG. 6 is a circuit diagram showing another embodiment of the vertical deflection output circuit of the present invention. In FIG. 6, numeral 22 denotes a horizontal output transistor, 23 denotes a d.c. power supply for a horizontal output circuit, 24 denotes a choke coil connected in series with the d.c. power supply 23, 25 denotes a damper diode, 26 denotes a horizontal resonance capacitor, 27 denotes a horizontal deflection yoke, and 28 denotes an S-distortion compensating capacitor, all of which constitute a horizontal deflection circuit.

The operation of the horizontal deflection circuit is briefly explained. During the earlier half of the horizontal scan period, an energy which has been stored in the horizontal deflection yoke 27 immediately before that period serves as a power supply so that a horizontal deflection current flows in a loop comprising the horizontal deflection yoke 27, S-distortion compensating capacitor 28 and the damper diode 25. During the later half of the horizontal scan period, the horizontal output transistor 22 conducts so that the horizontal deflection current flows in a loop comprising the horizontal deflection yoke 27, horizontal output transistor 22 and the S-distortion compensating capacitor 28.

During the horizontal retrace period, the horizontal deflection current is reversed within a given short time by the parallel resonance of an inductance component of the horizontal yoke 27 and the resonance capacitor 26, and an energy required for the next horizontal scan period is stored across the horizontal deflection yoke 27 at the end of the horizontal retrace period. As a result, a flyback pulse 14' superimposed on the d.c. voltage of the d.c. power supply 13 appears at a junction point B.

While the horizontal flyback pulse 14' is appearing at the junction point B, that is, during the horizontal retrace period, the diode 9 conducts to energize the choke coil 11. After the horizontal flyback pulse has terminated, a continuous current flows through the choke coil 11 by the energy stored in the choke coil which has been previously energized. Thus, the diode 9, choke coil 11 and capacitor 12 form a choke-input rectifying circuit.

In a conventional rectifying choke-input half-wave rectifying circuit, it is necessary to provide a diode 10, which is called a flywheel diode, as shown in FIG. 3, to allow a continuous current to flow through the choke coil 11 because the input pulse does not include d.c. component. In the choke-input rectifier circuit shown in FIG. 6, such a flywheel diode is not required because the input pulse includes the d.c. component. An output voltage-current characteristic of the choke-input rectifying circuit shown in FIG. 7 is similar to that shown in FIG. 4 and the power supply voltage is equal to the voltage $E_k$ because the critical current is reached at the power supply voltage of the d.c. power supply 23.

When a load current higher than the critical current $I_k$ is required, the diode 9 always conducts so that the continuous current flows through the choke coil 11 to produce the substantially constant output voltage $E_k$. When the load current is below the critical current $I_k$, the diode 9 repeats the conduction state and the non-conduction state. As a result, a discontinuous current flows through the choke coil 11 and the output voltage assumes a value between the maximum value $E_p$ and the mean value $E_k$ of the horizontal flyback pulse developed at the junction point B.

Accordingly, like in the embodiment of FIG. 3, during the vertical retrace period $T_r$ during which the vertical deflection output circuit does not require the load current, a high output voltage $E_R$ is produced, and during the earlier half of the vertical scan period of time when the load current exceeding the critical current is required, a low output voltage $E_R$ is produced.

FIG. 7 is a circuit diagram showing a further embodiment of the vertical deflection output circuit of the present invention. In the present embodiment, during the earlier half of the vertical scan period, a voltage required for the vertical output stage 56 is supplied from a separate d.c. power supply 60, which comprises a second low voltage winding 8' of the flyback transformer 80, a diode 31 and a capacitor 32. The voltage $E_k$ of the choke-input rectifying circuit at the critical current $I_k$ is chosen not to be higher than a power supply voltage $E_a$ of the additional d.c. power supply 60. When a load current which is higher than a load current $I_a$ corresponding to a voltage $E_a$ in the voltage-current characteristic of the choke-input rectifying circuit flows, the diode 33 conducts so that the voltage applied to the vertical output stage 56 is clamped at the power supply voltage $E_a$ of the additional power supply 60.

During the vertical retrace period $T_r$, the collector voltage $E_c$ of the output transistor 2 abruptly decreases because the charge in the capacitor 12 is abruptly discharged. Accordingly, it takes a certain amount of time before the collector voltage $E_c$ decreases to $E_a$ after the collector current of the output transistor 2 has exceeded $I_a$. This period of time is determined mainly by the capacitance of the capacitor 12. It is possible to select the capacitance of the capacitor 12 such that the collector voltage $E_c$ reaches the voltage $E_a$ at the end of the vertical retrace period $T_r$. After the collector voltage of the output transistor 2 has reached the voltage $E_a$, that is, after the start of the vertical scan period, that portion of the collector current which exceeds the current $I_a$ is supplied from the additional power supply 60 so that the collector voltage $E_c$ is kept at the voltage $E_a$. The time at which the collector current decreases to the current $I_a$ occurs slightly earlier than the end time of the earlier half of the vertical scan period $T_s$, but because the collector voltage does not rise abruptly, the collector voltage at the end time of the earlier half of the vertical scan period $T_s$ is substantially equal to the voltage $E_a$.

The rectifying and filtering circuit comprising the diode 31 and the capacitor 32 may be eliminated such that the diode 33 and the capacitor 12 function in place of them. In this case, when the load current is small, the diode 33 is non-conductive because the voltage across the capacitor 12 is high, and when the load current exceeds the current $I_a$, the exceeded portion of the current is supplied through the rectifying action of the diode 33. The arrangement of clamping the collector voltage $E_c$ to the voltage $E_a$ by the additional power supply circuit 60 is particularly effective to a circuit in which the horizontal flyback pulse is used as the a.c. voltage supplied to the choke-input rectifying circuit. When the collector current abruptly increases within the vertical retrace period without clamping, the horizontal deflection circuit is influenced because the capacitance of the capacitor 12 is limited in order to improve the power efficiency as described above, so that a phenomenon of shrinkage in the horizontal size during a short period immediately after the start of the vertical scan may occur. It is considered that this occurs because the energy supplied to the output stage 56 abruptly increase to increase the exciting current flowing in the choke coil 11 so that the energy supplied to the horizontal deflection circuit temporarily becomes short. By supplying the abruptly increasing current from the separate power supply 60, the above undesired phenomenon can be prevented.

In the embodiment of FIG. 6, by connecting the diode 33 in a manner shown by a dotted line, the charge voltage of the capacitor 12 when the load current exceeds the critical current $I_k$ can be maintained at the voltage $E_k$ of the d.c. power supply 23.

FIG. 8 is a circuit diagram showing another embodiment of the vertical deflection output circuit of the present invention. In the present embodiment, the flywheel diode 10 and the additional winding 8' forming the additional power supply 60 shown in FIG. 7 are eliminated, while the circuit still provides a similar advantage to that of FIG. 7. In FIG. 8, a flyback pulse 14" of positive polarity is produced at a junction point of the low voltage winding 8 and a diode 31'. A rectifying and filtering circuit comprising the diode 31' and a capacitor 32' functions similarly to the rectifying and filtering circuit comprising the diode 31 and the capacitor 32 shown in FIG. 7. During the horizontal scan period, the diode 31' conducts so that the capacitor 32' is charged to the mean value $E_k$ of the horizontal flyback pulse 14" developed in the winding 8. The charge voltage of the capacitor 32' is very stable against the variation of the load current required for the vertical output stage 56. The diode 9 rectifies the horizontal flyback pulse 14" superimposed on the charge voltage $E_k$ of the capacitor 32'. During the horizontal retrace period, the diode 9 conducts and the current flowing in the diode 9 flows through a path including the capacitor 12, the capacitor 32', the low voltage winding 8 and the choke coil 11, thereby to charge the capacitor 12. Thus, when the load current increases, the diodes 31' which conducts during the horizontal scan period functions similarly to the flywheel diode. As a result, the current flowing in the choke coil 11 is continuous. Namely, the choke-input rectifying and filtering circuit comprising the diode 9, choke coil 11 and the capacitor 12 rectifies and filters the horizontal flyback pulse 14" having d.c. component. Accordingly, the present embodiment also exhibits the voltage-current characteristic as shown in FIG. 4 and the critical current $I_k$ flows at the charge voltage $E_k$ of the capacitor 32'.

The anode of the diode 10 which acts as the flywheel diode in FIG. 7 may be connected to the separate d.c. power supply 60 as shown in FIG. 9. In the embodiment of FIG. 9, since the voltage at a junction point C of the choke coil 11 and the diode 9 does not decrease below the voltage $E_a'$ of the additional d.c. power supply 60, a mean value of the voltage at the junction point C is higher than when the anode of the diode 10 is grounded as shown in FIG. 3, and hence the voltage $E_k$ corresponding to the critical current $I_k$ is also higher. Accordingly, the number of turns of the winding 8 is reduced to obtain the desired voltage $E_k$ so that the maximum voltage $E_p$ is also reduced. When the horizontal flyback pulse having the duty factor of 1/6 to 1/9, the ratio $E_p/E_s$ can be approached to 2 to 3 which is required for the vertical deflection output circuit. As a result, the resistor 13 may be eliminated or it may be of high resistance so that the power consumption by the resistor 13 is completely or substantially nullified.

FIG. 10 is a circuit diagram of a further embodiment of the present invention. A flyback pulse 144 which is at ground potential during the horizontal scan period and of positive polarity during the horizontal retrace period is produced at the cathode of the diode 31'. A mean value $E_a'$ of the horizontal flyback pulse 144 is produced across the capacitor 32'. Since the d.c. voltage is added to the horizontal flyback pulse developed in the low voltage winding 8, the number of turns of the low voltage winding 8 can be reduced like in the embodiment of FIG. 9.

The anode of the diode 10 in FIG. 9 may be connected to the anode of the diode 31 instead of the cathode of the diode 31. In this case, during the horizontal retrace period and the scan period, the diodes 9 and 10 conduct, respectively. As a result, the diodes 9 and 10 perform full-wave rectification. Thus, the current flowing in the choke coil 11 is more continuous and hence the inductance of the choke coil 11 may be smaller than that in the other embodiment to attain the same critical current $I_k$.

The anode of the diode 10 in the embodiment of FIG. 10 may be connected to either end of the winding 8' instead of being grounded, to obtain a similar advantage.

What is claimed is:

1. A vertical deflection output circuit comprising:
a vertical deflection yoke;
a single-ended push-pull circuit for supplying a vertical deflection current to said vertical deflection yoke; and
power supply means for supplying to said single-ended push-pull circuit a first operating voltage for feeding to said vertical deflection yoke a predetermined vertical deflection current during a vertical scan period, and a second operating voltage, which is higher than said first operating voltage, for restoring the vertical deflection current during a vertical retrace period from its magnitude corresponding to the end of the vertical scan period to its magnitude corresponding to the start of the vertical scan period, said power supply means comprising:
a power source for generating a periodic voltage waveform whose peak value is equal to or higher than said second operating voltage and whose mean value in the same polarity as said peak value is equal to or lower than said first operating voltage; and
choke-input means coupled between said power source and said single-ended push-pull circuit for producing a d.c. voltage whose level decreases from said peak value to said mean value in accordance with an increase of a d.c. load current thereof from zero to a predetermined current level which is less than the maximum vertical deflection current; and
wherein said power source comprises a winding of a horizontal flyback transformer across which a horizontal flyback pulse is developed during the horizontal cycle.

2. A vertical deflection output circuit according to claim 1, wherein said winding is a low voltage winding wound on said horizontal flyback transformer.

3. A vertical deflection output circuit comprising:
a vertical deflection yoke;
a single-ended push-pull circuit for supplying a vertical deflection current to said vertical deflection yoke; and
a power supply means for supplying to said single-ended push-pull circuit a first operating voltage for feeding to said vertical deflection yoke a predetermined vertical deflection current during a vertical scan period, and a second operating voltage, which is higher than said first operating voltage, for restoring the vertical deflection current during a vertical retrace period from its magnitude corresponding to the end of the vertical scan period to its magnitude corresponding to the start of the vertical scan period, said power supply means comprising:
a power source for generating a peridioc voltage waveform whose peak value is equal to or higher than said second operating voltage and whose mean value in the same polarity as said peak value is equal to or lower than said first operating voltage; and
choke-input means coupled between said power source and said single-ended push-pull circuit for producing a d.c. voltage whose level decreases from said peak value to said mean value in accordance with an increase of a d.c. load current thereof from zero to a predetermined current level which is less than the maximum vertical deflection current; and
wherein said power source produces a combined voltage with a d.c. voltage component and a horizontal flyback pulse superimposed on said d.c. voltage component.

4. A vertical deflection output circuit according to claim 3, wherein said power source includes a d.c. voltage component source having a first diode connected between one end of a low voltage winding wound on a horizontal flyback transformer and ground, and a capacitor connected between the other end of said low voltage winding and ground, whereby a d.c. voltage component developed across said capacitor is superimposed on said horizontal flyback pulse developed across said low voltage winding and said combined voltage is supplied to said choke-input means.

5. A vertical deflection output circuit according to claim 4, which further includes a second diode for applying the d.c. voltage component developed across said capacitor to said single-ended push-pull circuit.

6. A vertical deflection output circuit comprising:
a vertical deflection yoke;
a single-ended push-pull circuit for supplying a vertical deflection current to said vertical deflection yoke; and
power supply means for supplying to said single-ended push-pull circuit a first operating voltage for feeding to said vertical deflection yoke a predetermined vertical deflection current during a vertical scan period, and a second operating voltage, which is higher than said first operating voltage, for restoring the vertical deflection current during a vertical retrace period from its magnitude corresponding to the end of the vertical scan period to its magnitude corresponding to the start of the vertical scan period, said power supply means comprising:
a power source for generating a periodic voltage waveform whose peak value is equal to or higher than said second operating voltage and whose mean value in the same polarity as said peak value is equal to or lower than said first operating voltage; and
choke-input means coupled between said power source and said single-ended push-pull circuit for producing a d.c. voltage whose level decreases from said peak value to said mean value in accordance with an increase of a d.c. load current thereof from zero to a predetermined current level which is less than the maximum vertical deflection current; and
wherein said choke-input means comprises an input terminal connected to said power source, an output terminal connected to said single-ended push-pull circuit, a series circuit of a first rectifying element and a choke coil connected between said input and output terminals, and a filter capacitor connected between said output terminal and a reference potential; and
wherein said choke-input means comprises second rectifying element connected between a connecting point of said first rectifying element and said choke coil and said reference potential for preventing a current flowing through said choke-coil from discontinuing.

7. A vertical deflection output circuit according to claim 6, wherein said coke-input means includes power consuming means which is connected in parallel to said filter capacitor so that said d.c. load current flows therethrough whereby said d.c. voltage is prevented from rising beyond said second operating voltage.

8. A vertical deflection output circuit according to claim 6, wherein said choke-input means includes a clamping circuit having a d.c. clamping voltage source for providing a d.c. clamping voltage equal to said first operating voltage and a clamping diode having one end thereof connected to said clamping voltage source and the other end thereof connected to said output terminal, whereby said clamping diode may conduct when said single-ended push-pull circuit requires a circuit which exceeds at least said predetermined current level and may clamp the d.c. voltage of said choke-input means at the d.c. clamping voltage of said clamping voltage source.

9. A vertical deflection output circuit comprising:
a vertical deflection yoke;
a single-ended push-pull circit for supplying a vertical deflection current to said vertical deflection yoke; and
power supply means for supplying to said single-ended push-pull circuit a first operating voltage for feeding to said vertical deflection yoke a predetermined vertical deflection current during a vertical scan period, and a second operating voltage, which is higher than said first operating voltage, for restoring the vertical deflection current during a vertical retrace period from its magnitude corresponding to the end of the vertical scan period to its magnitude corresponding to the start of the vertical scan period, said power supply means comprising:
a power source for generating a periodic voltage waveform whose peak value is equal to or higher than said second operating voltage and whose mean value in the same polarity as said peak value is equal to or lower than said first operating voltage; and
choke-input means coupled between said power source and said single-ended push-pull circuit for producing a d.c. voltage whose level decreases from said peak value to said mean value in accordance with an increase of a d.c. load current thereof from zero to a predetermined current level which is less than the maximum vertical deflection current; and
wherein said choke-input means comprises an input terminal connected to said power source, an output terminal connected to said single-ended push-pull circuit, a series circuit of a first rectifying element and a choke coil connected between said input and output terminals, and a filter capacitor connected between said output terminal and a reference potential; and
wherein said power source comprises a winding of a horisontal flyback transformer across which a horizontal flyback pulse is developed during the horizontal cycle.

10. A vertical deflection output circuit comprising:
a vertical deflection yoke;
a single-ended push-pull circuit for supplying a vertical deflection current to said vertical deflection yoke; and
power supply means for supplying to said single-ended push-pull circuit a first operating voltage for feeding to said vertical deflection yoke a predetermined vertical deflection current during a vertical scan period, and a second operating voltage, which is higher than said first operating voltge, for restoring the vertical deflection current during a vertical retrace period from its magnitude corresponding to the end of the vertical scan period to its magnitude corresponding to the start of the vertical scan period, said power supply means comprising:
a power source for generating a periodic voltage waveform whose peak value is equal to or higher than said second operating voltage and whose mean value in the same polarity as said peak value is equal to or lower than said first operating voltage; and
choke-input means coupled between said power source and said single-ended push-pull circuit for producing a d.c. voltage whose level decreases from said peak value to said mean value in accordance with an increase of a d.c. load current thereof from zero to a predetermined current level which is less than the maximum vertical deflection current;
wherein said coke-input means comprises an input terminal connected to said power source, an output terminal connected to said single-ended push-pull circuit, a series circuit of a first rectifying element and a choke coil connected between said input and output terminals, and a filter capacitor connected between said output terminal and a reference potential; and
wherein said power source produces a combined voltage with a d.c. voltage component and a horizontal flyback pulse superimposed on said d.c. voltage component.

* * * * *